United States Patent
Pomeranz et al.

(10) Patent No.: US 11,482,834 B1
(45) Date of Patent: Oct. 25, 2022

(54) HIGH POWER LONG WAVELENGTH PULSED IR LASER SYSTEM WITH HIGHLY VARIABLE PULSE WIDTH AND REPETITION RATE

(71) Applicant: BAE SYSTEMS Information and Electronic Systems Integration Inc., Nashua, NH (US)

(72) Inventors: Leonard A. Pomeranz, Hollis, NH (US); Scott D. Setzler, New Boston, NH (US); Jojit C. Torcedo, Chelmsford, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 105 days.

(21) Appl. No.: 17/218,879

(22) Filed: Mar. 31, 2021

(51) Int. Cl.
  *H01S 5/04* (2006.01)
  *H01S 5/042* (2006.01)
  *H01S 5/50* (2006.01)
  *H01S 5/026* (2006.01)

(52) U.S. Cl.
  CPC ............ *H01S 5/041* (2013.01); *H01S 5/0265* (2013.01); *H01S 5/0428* (2013.01); *H01S 5/50* (2013.01)

(58) Field of Classification Search
  CPC .................................. H01S 5/041; H01S 5/04
  USPC ...................................................... 372/38.02
  See application file for complete search history.

(56) References Cited

U.S. PATENT DOCUMENTS

| | | | |
|---|---|---|---|
| 4,965,803 A | 10/1990 | Esterowitz et al. | |
| 6,775,053 B2 | 8/2004 | Jovanovic et al. | |
| 8,189,644 B2 | 5/2012 | Mu et al. | |
| 8,873,134 B2 | 10/2014 | Price et al. | |
| 9,209,592 B2 | 12/2015 | Imeshev et al. | |
| 9,335,414 B2 | 5/2016 | Leyva | |
| 9,583,907 B2 | 2/2017 | Boland et al. | |
| 9,810,786 B1 | 11/2017 | Welford et al. | |
| 9,923,329 B2 | 3/2018 | Savage-Leuchs et al. | |
| 9,952,315 B2 | 4/2018 | Boland et al. | |

(Continued)

FOREIGN PATENT DOCUMENTS

CN   103869302 B   4/2017

OTHER PUBLICATIONS

Tang, Yulong, et al. "50-W 2-um Nanosecond All-Fiber-Based Thulium-Doped Fiber Amplifier", IEEE Journal of Selected Topics in Quantum Electronics, vol. 20, No. 5. 7 Pages. 2014.

(Continued)

*Primary Examiner* — Tuan N Nguyen
(74) *Attorney, Agent, or Firm* — Maine Cernota & Rardin

(57) ABSTRACT

A laser system produces pulses having wavelengths between 2000 nm and 2100 nm, peak output powers greater than 1 kW, average powers greater than 10 W, pulse widths variable from 0.5 to 10 nsec, pulse repetition frequencies variable from 0.1 to over 2 MHz, and a pulse extinction of at least 60 dB. Pulses from a diode laser having a wavelength between 1000 nm and 1100 nm are amplified by at least one fiberoptic amplifier and applied as the pump input to an Optical Parametric Amplifier (OPA). A cw laser provides an OPA seed input at a wavelength between 2000 nm and 2200 nm. The idler output of the OPA having difference frequency wavelength between 2000 nm and 2100 nm is further amplified by a crystal amplifier. The fiberoptic amplifier can include Ytterbium-doped fiberoptic. The crystal amplifier can include a Ho:YAG, Ho:YLF, Ho:LuAG, and/or a Ho:Lu2O3 crystal.

19 Claims, 6 Drawing Sheets

(56) References Cited

U.S. PATENT DOCUMENTS

| | | | |
|---|---|---|---|
| 10,186,826 B2 | 1/2019 | Wielandy | |
| 10,274,809 B1 * | 4/2019 | Pomeranz | ............... G02F 1/39 |
| 10,418,776 B2 | 9/2019 | Welford et al. | |
| 2014/0050234 A1 * | 2/2014 | Ter-Mikirtychev | ........................ |
| | | | H01S 3/06758 |
| | | | 372/6 |

OTHER PUBLICATIONS

Wang, Xiong, et al. "105 W Ultra-Narrowbend Nanosecond Pulsed Laser at 2 Um Based on Monolithic Tm-Doped Fiber MOPA", Optical Society of America. 9 Pages. 2015.

"2 Micron Q-Switched Fiber Laser Module", AdValue Photonics, 2 Pages.

"EVERESTnano 2Um Pulsed Fiber Laser", AdValue Photonics, 2 Pages.

"Pulsed Single-Frequency Fiber Laser", AdValue Photonics, 2 Pages.

Zhang, Ye, et al. "Constant Pulse Duration Electro-optically Cavity-dumped Ho: YAG Laser", CLEO, 2 Pages. 2016.

Dorrer, C., et al. "High-Contrast Optical-Parametric Amplifier as a Front End of High-Power Laser Systems", Optics Letters, vol. 32, No. 15, 2143-2145. 2007.

Mu, Xiaodong, et al. "High Efficiency, High Power 2.097-Um Ho:YAG Laser", Optical Society of America, 3 Pages. 2010.

Dergachev, Alex & Amzajerdian, Farzin, "High-gain Amplification of Directly-modulated, Single-frequency, 2-Um Source", Optical Society of American, 3 Pages. 2013.

Yao, Weichao, et al., "High-Power Nanosecond Pulse Generation From an Integrated Tm—Ho Fiber MOPA Over 2.1 Um", Optics Express, vol. 26, No. 7. 8 Pages. 2018.

Liu, X., et al., "High-Power Passively Q-Switched 2 Um All-Solid-State Laser Based on a Bi2Te3 Saturable Absorber", Photonics Research, vol. 5, No. 5. 461-466. 2017.

"PTFL-KULT Pulsed Thulium Fiber Laser 2.0 Um Ultra-Compact Laser Transmitter", Keopsys. 2 Pages.

"Thulium Doped Fiber Amplifier", Nuphoton Technologies, 2 Pages.

Hadrich, S., et al. "CW Seeded Optical Parametric Amplifier Providing Wavelength and Pulse Duration Tunable Nearly Transform Limited Pulses", Optical Society of America, vol. 18, No. 3. 3158-3167. 2010.

"TLPN-1-1-20-M Thulium Nanosecond Fiber Laser", IPG Photonics. 2 Pages.

"Nanosecond Fiber Lasers", IPG Photonics. Website: https://www.ipgphotonics.com/en/products/lasers/nanosecond-fiber-lasers, downloaded Dec. 20, 2020.

\* cited by examiner

HIGH POWER LONG WAVELENGTH PULSED IR LASER SYSTEM WITH HIGHLY VARIABLE PULSE WIDTH AND REPETITION RATE

FIELD

The disclosure relates to lasers, and more particularly, to pulsed lasers that operate at high pulse repetition frequencies (>100 kHz), generate high peak power (>1 kW), and generate high average power (>10 W).

BACKGROUND

Pulsed laser sources are useful for many applications, including LIDAR, communications, manufacturing and defense. Important parameters that characterize these laser sources include peak power (the instantaneous power during each pulse), pulse width (the duration of each laser pulse), repetition rate or pule repetition frequency (PRF) (the number of pulses produced per second), pulse energy (the integrated power over each pulse duration), average power (the pulse energy times the PRF), wavelength of the pulses, and depth of modulation (the ratio of the peak power during the pulse to residual power output between the pulses, also referred to as the on/off ratio). Many applications benefit from pulsed laser sources that operate with high PRF (>100 kHz), high peak power (>1 kW), short pulse width (<10 ns) and high average power (>10 W). Furthermore, it can be important in many applications for the pulsed laser source to be "agile," i.e. to be able to vary the peak power, pulse width, and/or PRF over wide ranges. Laser sources that have all of these features, i.e. PRF>100 kHz, peak power>1 kW, and pulse widths<10 ns, with widely variable peak power, pulse width, and PRF, are referred to here as "Powerful Rapid and Agile" pulsed laser sources, or "PRA" laser sources.

Many or most of the applications that currently implement PRA pulsed laser sources use PRA lasers that emit pulses having wavelengths of about 1 micron or about 1.5 microns. There are many other potential applications of PRA pulsed laser sources that would benefit from PRA pulsed laser sources that emitted pulses having wavelengths in the 2 um range. Unfortunately, however, PRA laser sources have not been available in the 2 micron range, i.e. having wavelengths between 2000 nm and 2100 nm.

It can be challenging to construct a PRA pulsed laser source. Some architectures are well-suited to producing pulses having peak powers greater than 1 kW, but they do not enable independent control of the pulse widths, PRF, and average power.

One common approach is to use a pulsed laser that implements a Q-switched oscillator, many of which can generate energetic pulses having greater than 1 kW peak power. However, pulsed lasers that implement Q-switched oscillators, are typically limited to <100 kHz PRF, and typically offer no independent control of pulse width as a function of the PRF and pulse energy. Furthermore, generation of pulse widths below 10 ns is challenging when using this approach.

Another approach is to use a pulsed laser that implements cavity dumping. However, this approach is also limited to <100 kHz PRF, and because the pulse width is determined by the laser cavity roundtrip time it is not easily varied. While pulse widths on the order of 1 ns can be generated using this approach, the pulse width cannot be changed without modifying the laser cavity.

Yet another approach is to use a pulsed laser that implements mode-locking. According to this approach, the repetition rate can be >1 MHz with pulse widths less than 1 nsec. However, the PRF in this approach is fixed by the cavity length, and cannot easily be adjusted.

The most common approach to generating PRA laser pulses in the 1 micron range is to generate low power laser pulses that are rapid and agile, and then to apply these low power pulses as a seed input to a high gain laser amplifier. Direct pulsing of semiconductor laser diodes can produce continuously adjustable laser pulse widths from <1 ns to >10 ns over a wide range of PRFs, but peak power will be limited to the power output of the laser diode (up to hundreds of mW). In many cases, as illustrated in FIG. 1, a waveform generator 102 can be used to control the pulse widths and PRF simply by causing the waveform generator 102 to pulse the electronic drive current that is applied to a diode laser 100 at the desired pulse width and PRF.

Alternatively, an external modulator can be implemented after a CW source to provide laser pulses. Fast modulation can be achieved using fiber-coupled electro optic modulators (e.g., Mach Zehnder devices) that can be used to convert a low power continuous wave beam into a train of low power pulses 108 that are highly adjustable and variable in pulse width and PRF.

A significant drawback of this approach can be the depth of modulation, i.e. the quantity to which the diode laser is turned off when no driver is applied, or to what degree the external modulator is closed between laser pulses. This feature is referred to herein as the "on/off ratio" or simply the "extinction" of the laser pulses. For example, a 1 ns wide laser pulse with a 1 MHz PRF has a duty cycle of 0.1%. If the depth of modulation is 30 dB, or 1000×, then there will be as much power emitted between pulses as there is during the pulses. The modulation depth can be improved by using a plurality of modulators in series. However, significant losses in pulse power can result.

Another challenge of this approach is to provide up to 50 dB of laser pulse amplification so as to boost the laser average pulse power to approximately 10 W or more, so that the pulses can then be further amplified by a crystal laser. One approach is to use one or more fiber-based optical amplifiers 104. The high gain that is provided by doped, single mode waveguides in glass fibers having lengths between 1 meter and 10 meters can be an excellent medium for amplification of low power laser pulses.

However, this approach can only be implemented within a few narrow wavelength ranges. Specifically, Ytterbium-doped fiber amplifiers can provide amplification in the 1000 to 1100 nm range, while Erbium-doped fiber amplifiers can provide amplification in the 1500 to 1600 nm range. Both of these fiber amplifiers have been employed to produce pulses having pulse widths of less than 1 us, PRFs greater than 100 kHz, and average power greater than 10 W, and can produce useful waveforms at these wavelengths. As an example, pulses from a directly pulsed 1030 nm diode that have 100 mW peak power and are modulated to 0.1 mW average power can be amplified by a factor of up to 40-50 dB by a fiber optic amplifier, thereby providing output pulses of 5-10 W average power.

Even greater amplification can sometimes be achieved using fiberoptic amplification. However, at some point using a fiber as the amplification medium reaches a maximum limit. For a given fiber waveguide dimension there will be a limit beyond which the peak power density creates non-linear effects that change the spectral, temporal, and spatial aspects of the amplified signal and compete with the desired amplification. Ultimately the fiber will be limited by power and energy density damage. Larger mode diameter fibers can reach higher power levels, but present additional challenges to maintain spatial and polarization properties as well as for splicing of the glass components.

So as to reach peak laser pulse powers of 1 kW and more, the "medium power" pulses of 5-10 W peak power that are provided by a fiberoptic laser amplifier can be further amplified by one or more bulk crystalline amplifiers 106 which also allow the beam size to be greatly expanded. For instance, pulses from a 1030 nm diode laser can be amplified by one or more Ytterbium doped glass fiber amplifier stages and then guided through free space into a larger dimensioned, Ytterbium-doped glass or crystal laser, such as an Yttrium Aluminum Garnet crystal that has been doped with Ytterbium (Yb:YAG). The type of crystal that is used in the amplifier will determine the limit of the wavelength range which can be efficiently amplified. For instance Yb:YAG will only efficiently amplify wavelengths close to 1030 nm whereas Nd:YAG will only efficiently amplify wavelengths close to 1064 nm.

While this approach of combining a low power pulsed laser source with fiberoptic amplification followed by crystal laser amplification can provide PRA pulses in the 1000 nm range, it is not possible, or at least not practical, to implement the same approach for wavelengths in the 2000 nm range. The problem lies mainly in the step of fiberoptic amplification. Direct modulation of 2000 nm CW sources can be achieved in the same fashion as for 1000 nm sources, and Thulium or Holmium doped crystalline amplifiers are available for amplification of medium power pulses (e.g. about 10 W peak power) at selected wavelengths in the 2000 nm range up to 1 kW peak power and more. However, fiberoptic amplification of low power pulses to produce medium power pulses can be highly challenging in the 2000 nm wavelength region.

In theory, Thulium and Holmium doped fibers could be used to amplify low power 2000 nm sources up to medium power levels. However, while Holmium doped fibers show promise for high gain, they represent an immature technology that is not readily available, and the fibers are not easily pumped. And while Thulium doped fibers are more readily available and are more easily pumped, fiber optic laser amplifiers based on Thulium doped fibers typically suffer from very low gain, such that achieving 50 dB of amplification of a weak seed source would require several amplifier stages and long lengths of doped fiber. It has been found that using long Thulium doped fiber lengths leads to significant energy losses due to out-of-band amplified spontaneous emission (ASE). As a result, a Thulium doped fiber optic amplifier would be highly inefficient, and would require a very long fiber length that would be impractical for most applications.

What is needed, therefore, is a laser system that can produce PRA laser pulses having a high on/off ratio in the 2000 nm wavelength region.

SUMMARY

The present laser system can produce laser pulses having wavelengths longer than 2000 nm that are "Powerful, Rapid, and Agile" (PRA), where PRA laser pulses are defined herein as laser pulses having peak output powers greater than 1 kW, average powers greater than 10 W, pulse widths that are variable from 0.5 to 10 nsec, and variable pulse repetition frequencies (PRF) ranging from 0.1 to over 2 MHz. In addition, the present system provides pulses having a nearly infinite on/off ratio, which in embodiments is at least an on/off ratio of 60 dB.

The disclosed laser system comprises a low power "seed" laser source, such as a diode laser, that is configured to produce low power "1 micron" laser pulses, i.e. laser pulses having a wavelength between 1000 nm and 1100 nm, with widely variable pulse widths and pulse repetition frequencies. In an exemplary embodiment the seed pulses have a wavelength of 1030 nm. The disclosed laser system further includes an Ytterbium doped fiber optic amplifier having a gain of up to 50 dB that is able to amplify the 1 micron pulses to medium power levels by use of one or more amplification stages. In the exemplary embodiment, the average power output of the fiber amplifier is between 1 and 20 watts, depending on pulse width and PRF.

According to the present disclosure, the medium power output of the 1 micron fiberoptic amplifier is used as the "pump" input beam of an optical parametric amplifier (OPA), while a continuous wave (cw) laser is used to apply a cw laser beam having a wavelength that is between 1800 and 2500 nm as the "seed" input beam to the OPA. In the exemplary embodiment, the seed input is between 2000 nm and 2100 nm. The CW average power is over 100 mW, and in the exemplary embodiment is 1 or more watts.

The pump and seed lasers are optically combined and adjusted to satisfy a phase matching or quasi phase matching condition within the OPA, resulting in a nonlinear mixing process that transfers energy from the pump input beam to the seed input beam, which emerges from the OPA as the "signal" output beam. The mixing of the pump and seed beams within the OPA also creates an "idler" output beam at the difference frequency between the pump and seed beams, where the pump frequency is equal to the seed frequency plus the idler frequency. Expressed in terms of wavelength, this means that $1/\lambda_p = 1/\lambda_s + 1/\lambda_i$. The phase matching or quasi phase matching condition may be met by using an appropriately selected birefringence phase matching crystal or quasi phase matched crystal as the OPA crystal, where the crystal properties such as angle, temperature, orientation, and/or grating period are set accordingly as understood by those in the field.

The emerging signal and residual pump beams are blocked by a bandpass filter, leaving on the idler output, which replicate the pulse repetition rate the pump pulses at the newly created difference frequency. The OPA will not produce an idler output unless the pump input power is above a certain minimum threshold. For that reason, the on/off ratio of the idler output of the OPA is nearly infinite, and in embodiments is at least an on/off ratio of 60 dB.

When using appropriately selected crystals as the OPA crystals to achieve birefringent or quasi phase matching conditions, along with applying sufficiently powerful peak power pump and cw signal level, as is known to those who skilled in the art of nonlinear optics, the conversion efficiency of the pump to the longer wavelength idler beam will reach a very high level. The quantum defect limited conversion efficiency is the ratio of the idler to the pump wavelength, which can reach close to 50%. Practical efficiencies of well over 20% can be obtained. The idler output from the OPA hence provides 2 micron agile pulses having the twin advantages of 1) the equivalent of several 10 s of dB nonlinear gain and 2) high pulse extinction (pulse on/off ratio) of at least 60 dB, that could not be practically achieved by using a 2 micron based cw pulsed seed along with 2 um linear fiber amplifier components. This nonlinear amplification process of the OPA in the exemplary embodiment can produce over 1 W average power.

While the average power level of the OPA idler output, which can be up to 1 W or more, may be sufficient to some applications, higher power PRA pulses can be generated by additional amplification of the OPA idler pulses using one or more stages of crystalline amplification. As those of skill in the art will understand, an appropriately selected crystalline amplifier having an emission peak that matches the idler wavelength can further amplify the medium power idler output pulses up to 1 kW peak power or more.

In the exemplary embodiments, the signal and pump wavelengths are selected to generate an idler wavelength that is well matched to the peak gain regions of crystalline laser amplifiers in the wavelength range between 2000 nm and 2200 nm. In one exemplary embodiment, the idler wavelength is 2050 nm, and in another exemplary embodiment the idler wavelength is 2090 nm.

An appropriately selected pump and signal wavelength will cause the OPA to produce an idler wavelength that will result in maximum amplification by the crystalline amplifier. For example, a Ho:YLF amplifier can be used to amplify idler pulses at 2050 nm, or a Ho:YAG amplifier can be used to amplify idler pulses at 2090 nm. The high extinction (>60 dB) of the idler pulses generated by the nonlinear process of the OPA is maintained when the pulses are amplified by the bulk crystalline amplifiers. Use of one or more crystalline amplifiers can further amplify the idler pulse by another 20 dB to provide PRA pulses with greater than 60 dB extinction.

The present system thereby circumvents the lack of suitable fiberoptics for preamplification of low power laser pulses at wavelengths longer than 2000 nm. Instead, the present system generates, modulates, and amplifies 1 micron laser pulses to a medium power level using efficient and readily available sources and fiberoptic amplifiers, and then uses an OPA and an appropriately selected cw "signal" laser to down-convert the pump wavelength and efficiently generate idler pulses in the 2 micron range with high extinction and medium peak power. The pump and signal wavelengths are selected such that the OPA idler wavelength matches the peak gain wavelength of a crystalline amplifier that provides further amplification of the medium power idler pulses to PRA pulses. In additional to "downshifting" the wavelengths of the laser pulses, the specific approach disclosed herein of using an OPA as the downshifting component provides the further advantage of producing pulses having a nearly infinite on/off ratio, which in embodiments is at least an on/off ratio of 60 dB.

In embodiments, the 1 micron fiberoptic amplifier of the present system includes a plurality of fiber optic laser amplifiers, and/or the final crystalline "power" amplifier comprises a plurality of crystalline laser amplifier stages. In some embodiments, the pulse repetition frequency can be further varied and/or modulated waveforms can be created by inserting a "pulse picker," such as an acousto-optic modulator or an electro-optic modulator, between the 1 micron fiberoptic amplifier and the OPA.

In embodiments, the PRA output pulses of the crystalline amplifier can then be further used as a "pump" to drive other nonlinear processes. For example, the highly amplified 2 micron idler pulses can be further down-converted to longer wavelengths by using parametric oscillators or amplifiers, or up-converted to shorter wavelengths by using methods such as second harmonic generation or sum frequency generation to achieve agile high extinction pulse trains at alternate wavelengths.

The present disclosure is a laser system configured to generate "Powerful Rapid and Agile" (PRA) laser pulses having a wavelength between 2000 nm and 2100 nm, where the PRA laser pulses are defined as laser pulses having a peak power greater than 1 kW, an average power greater than 10 W, pulse widths that are variable from 0.5 to 10 nanoseconds, and pulse repetition frequencies that are variable from 0.1 MHz to 2 MHz. The laser system includes a low power laser source configured to generate low power laser pulses having a pump wavelength between 1000 nm and 1100 nm, pulse widths variable from 0.5 ns to 10 ns, and a pulse repetition frequency variable from 0.1 MHz to 2 MHz, a fiber optic laser amplifier configured to amplify the low power laser pulses to higher power pump laser pulses having a peak power that is greater than 1 kW and an average power that is between 1 W and 20 W, a seed laser source configured to emit continuous wave seed laser light having a seed wavelength between 1800 and 2500 nm with continuous wave (CW) power between 100 mw and 5 W, an optical parametric amplifier (OPA) configured to receive the seed laser light as an OPA seed input and the pump laser pulses as an OPA pump input, wherein an OPA crystal of the OPA amplifier, the pump laser pulses, and the seed laser light are configured to satisfy a phase matching condition or a quasi-phase matching condition of the OPA, the OPA being thereby caused to emit a signal laser output and an idler laser output, the idler laser output having the same pulse repetition rate as the pump laser pulses, an idler wavelength that is longer than 2000 nm, and an on/off ratio of at least 60 dB, a band pass filter configured to separate the idler laser output from the signal laser output, and a crystalline laser amplifier configured to amplify the idler laser output to provide 2 micron PRA pulses having a peak power greater than 1 kW and an average power greater than 10 W. The pump wavelength and the signal wavelength are selected such that the idler wavelength is within the amplifying wavelength region of the crystalline amplifier.

In embodiments, the low power laser source comprises a diode laser, and wherein a laser output of the diode laser is modulated to form the low power laser light pulses by modulating a driver current that is applied to the diode laser.

In any of the above embodiments, the low power laser source can include a laser that is configured to emit continuous wave (CW) pump laser light, and the CW pump laser light can be modulated to form the low power laser pulses by a laser modulating device that is configured to receive the CW pump laser light and to emit the low power laser pulses. In some of these embodiments the laser modulating device is an electro-optic modulator that is one of an electro-optic modulator, an acousto-optic modulator, and a semiconductor optical amplifier (SOA). And in some of these embodiments the electro-optic modulator is a Mach Zehnder modulator.

In any of the above embodiments, the fiberoptic laser amplifier can include an Ytterbium doped fiber.

In any of the above embodiments, the fiberoptic laser amplifier can include a plurality of fiber optic amplification stages.

In any of the above embodiments, the OPA can include a quasi phase matched or a birefringent phase matched crystal.

In any of the above embodiments, the crystalline laser amplifier can include a crystal that is doped with Holmium or Thulium.

In any of the above embodiments, the crystalline laser amplifier can include a plurality of crystal laser amplification stages.

In any of the above embodiments, the crystalline laser amplifier can include at least one amplification module that is at least one of a multi-pass amplifier and a regenerative amplifier.

Any of the above embodiments can further include a wavelength shifting element configured to either upshift or downshift the wavelength of the PRA pulses provided by the crystalline laser amplifier.

Any of the above embodiments can further include a pulse picker configured to further modulate and/or shape the pump laser pulses after amplification thereof by the fiberoptic laser amplifier and before application thereof as the pump input of the OPA.

In any of the above embodiments, the pump wavelength can be 1030 nm. In some of these embodiments, the seed wavelength is 2030 nm, the idler wavelength is 2090 nm, the OPA includes a periodically poled lithium niobate (PPLN) crystal, and the crystal amplifier includes a Ho:YAG amplifier. Or the seed wavelength is 2071 nm, the idler wavelength is 2050 nm, the OPA includes a periodically poled lithium niobate (PPLN) crystal, and the crystal amplifier includes a Ho:YLF amplifier.

In any of the above embodiments, the crystal laser amplifier can include a Ho:YAG laser that is able to amplify wavelengths between 2089 nm and 2091 nm, as well as 2096 nm.

In any of the above embodiments, the crystal laser amplifier can include a Ho:YLF laser that is able to amplify wavelengths between 2050 nm and 2070 nm.

And in any of the above embodiments, the crystal laser amplifier can include a crystal that is doped with Holmium or Thulium.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

A laser system is disclosed that can produce "PRA" laser pulses having wavelengths that are longer than 2000 nm, where "PRA" laser pulses are defined herein as being "powerful, fast, and agile" laser pulses having peak output powers greater than 1 kW, average power greater than 10 W, pulse widths variable between 0.5 ns and 10 ns, and pulse repetition rates from 0.1 MHz to >2 MHz, together with an almost infinite on/off ratio of at least 60 dB.

Figure 1:
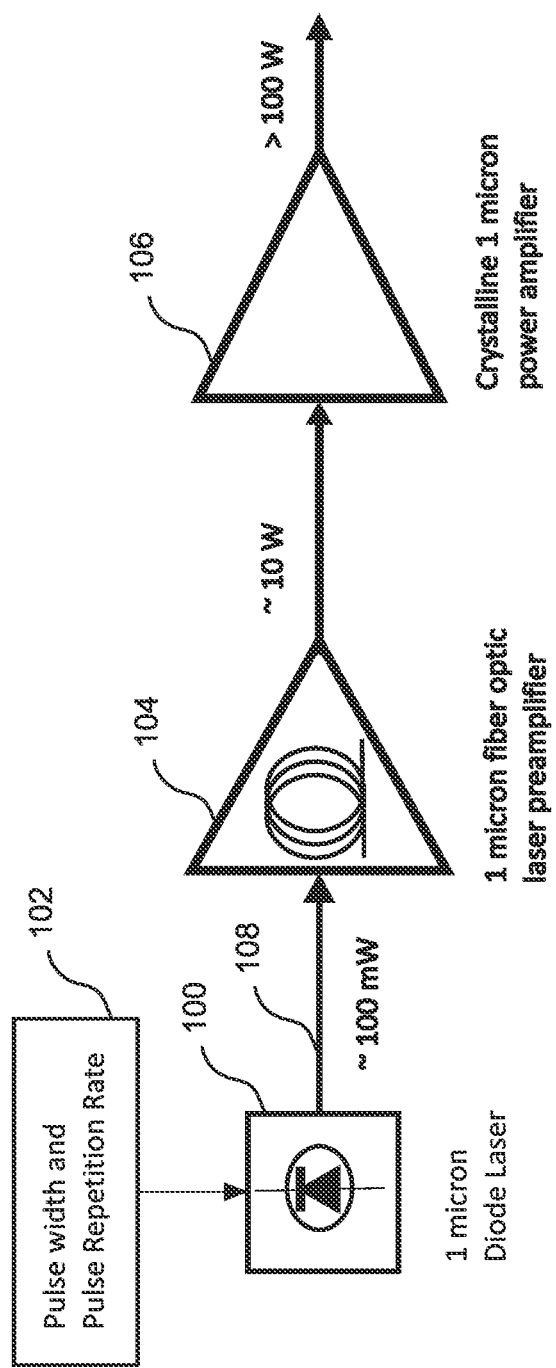
FIG. 1 is a block diagram illustrating a 1 micron PRA pulsed laser source of the prior art.
Figure 2:
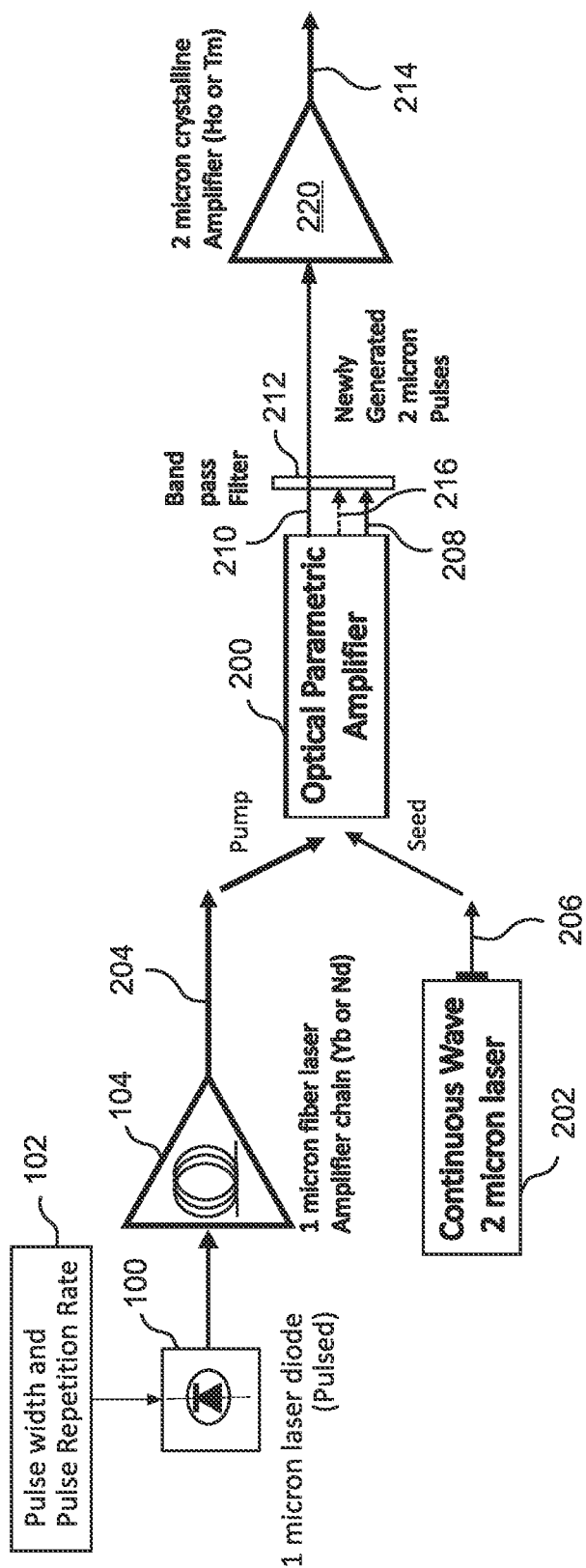
FIG. 2 is a block diagram illustrating a 2 micron PRA pulsed laser source according to an embodiment of the present disclosure.

With reference to FIG. 2, the disclosed laser system comprises a pulse agile low power laser source 100, such as a diode laser, that is configured to produce low power "1 micron" laser pulses 108, i.e. laser pulses having a wavelength between 1000 nm and 1100 nm, with widely variable pulse widths and pulse repetition frequencies. The disclosed laser system further includes a 1 micron fiber optic amplifier 104 that is able to amplify the low power 1 micron pulses 108 to higher powers, which can be up to 20 W average power and more than 1 kilowatt of peak power. Some embodiments implement 1 micron fiber optic amplifiers based on Ytterbium (Yb) doped fibers to efficiently amplify the 1000 nm laser pulses, According to the present disclosure, the output 204 of the 1 micron fiberoptic amplifier 104 is used as the "pump" input of an optical parametric amplifier (OPA) 200, while a continuous wave (cw) laser 202 is used to apply a cw laser beam 206, having a wavelength that is longer than the pump wavelength, to the OPA 200 as the "seed" input. In embodiments, the seed input has a wavelength that is between 1800 nm and 2500 nm.

The wavelengths of the pump 104 and seed 202 lasers, as well as the temperature and or the angle of the OPA 200, are selected and/or adjusted such that a phase match condition or a quasi phase match condition is satisfied within the OPA 200, resulting in a nonlinear mixing process that transfers energy from the pump input beam 204 to the seed input beam 206, which emerges from the OPA as the "signal" beam 208, and simultaneously creates a third "idler" beam 210 at the difference frequency between the pump 204 and seed 206 beams, where the pump frequency is equal to the seed frequency plus the idler frequency. Expressed in terms of wavelength, this means that $1/\lambda_p = 1/\lambda_s + 1/\lambda_i$. In embodiments, the idler wavelength is between 2000 nm and 2200 nm. In some embodiments, the idler wavelength is 2050 nm, and in other embodiments the idler wavelength is 2090 nm.

The emerging signal 208 and residual pump 216 beams are blocked by a bandpass filter 212, leaving only the idler output 210, which is a train of laser pulses that replicate the pulse repetition frequency of the pump pulses 204, but are produced at the difference frequency between the pump 204 and seed 206 frequencies. The OPA 200 will not produce an idler output 210 unless the input power of the pump 206 is above a certain minimum threshold. For that reason, the on/off ratio of the idler output 210 of the present system is nearly infinite, and in embodiments is at least an on/off ratio of 60 dB.

The pulsed idler output 210 of the OPA 200 is then further amplified by a bulk crystalline laser amplifier 220 to produce 2 micron PRA output pulses 214. For example, a Ho:YLF crystal amplifier can be used to amplify idler pulses at 2050 nm, or a Ho:YAG crystal amplifier can be used to amplify idler pulses at 2090 nm. Other possibilities include Tm:YLF and Tm:YAG amplifiers. There are many other host crystalline and glass materials that can be doped with Holmium or Thulium to provide 2 micron amplification, as is known in the art.

In various embodiments, the crystal laser amplifier includes at least one Ho:YAG crystal amplifier that is able to amplify wavelengths between 2089 nm and 2091 nm, as well as 2096 nm, a Ho:YLF crystal amplifier that is able to amplify wavelengths between 2050 nm and 2070 nm, a Ho:LuAG laser or a Ho:Lu2O3 laser, which have broad peak gain wavelength ranges that cover many regions in the 2000-2150 nm range. As is known in the art, there are numerous garnet and sesquioxide host materials that could potentially amplify 2 micron signals over a wavelength range from 2000-2150 nm.

For example, in a first exemplary embodiment the seed is a thulium doped fiber laser that emits a continuous wave beam having a wavelength of 2030 nm; the idler is a pulsed beam having a wavelength of 2090 nm; the OPA includes a periodically poled lithium niobate (PPLN) crystal; and the crystal amplifier includes a Ho:YAG amplifier. In a second exemplary embodiment, the seed is a thulium doped fiber laser that emits a continuous wave beam having a wavelength of 2071 nm; the idler wavelength is 2050 nm; the OPA includes a PPLN crystal; and the crystal amplifier includes a Ho:YLF amplifier.

Figure 3:
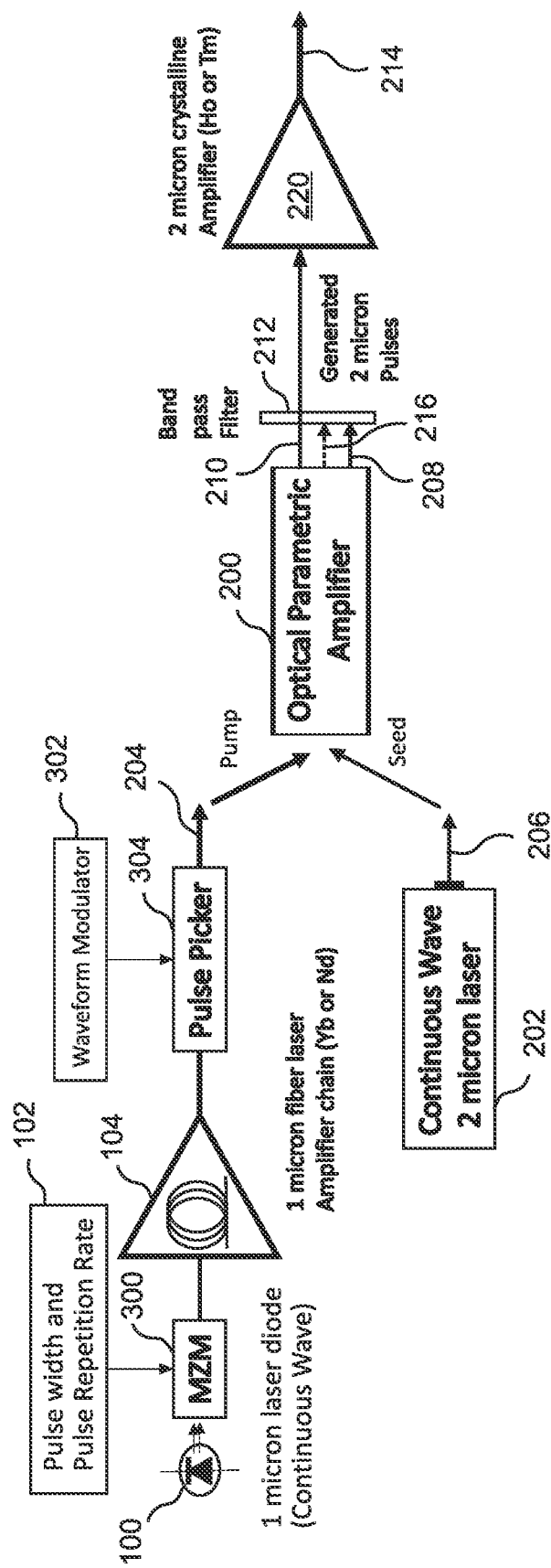
FIG. 3 is a block diagram illustrating an embodiment similar to FIG. 2, but including an external modulator and a pulse picker.

In the embodiment of FIG. 2, the low power laser source 100 is a pulsed diode laser 100, and the pulse widths and PRF are determined by a waveform generator 102 that pulses the drive current of the diode laser 100. In the embodiment of FIG. 3, the low power laser source 100 is a cw diode laser 100 having an output that is modulated by a Mach Zehnder modulator 300, which is driven by the waveform generator 102. In the embodiment of FIG. 3, the pulse repetition frequency and width are further varied, and/or modulated waveforms are created, by a "pulse picker" 304, such as an acousto-optic modulator or an electro-optic modulator, that is inserting between the 1 micron fiberoptic amplifier 104 and the OPA 200, and is driven by a waveform modulator 302.

By downshifting the wavelength of 1 micron pulses after fiberoptic amplification, the present system circumvents the lack of suitable fiberoptics for amplification of low power laser pulses at wavelengths longer than 2000 nm, such as in the "2 micron" 2000 nm to 2200 nm wavelength range. In additional to "downshifting" the wavelengths of the laser pulses, the specific approach disclosed herein of using an OPA as the downshifting component provides the added advantage of producing pulses having a nearly infinite on/off ratio of at least 60 dB.

Figure 4A:
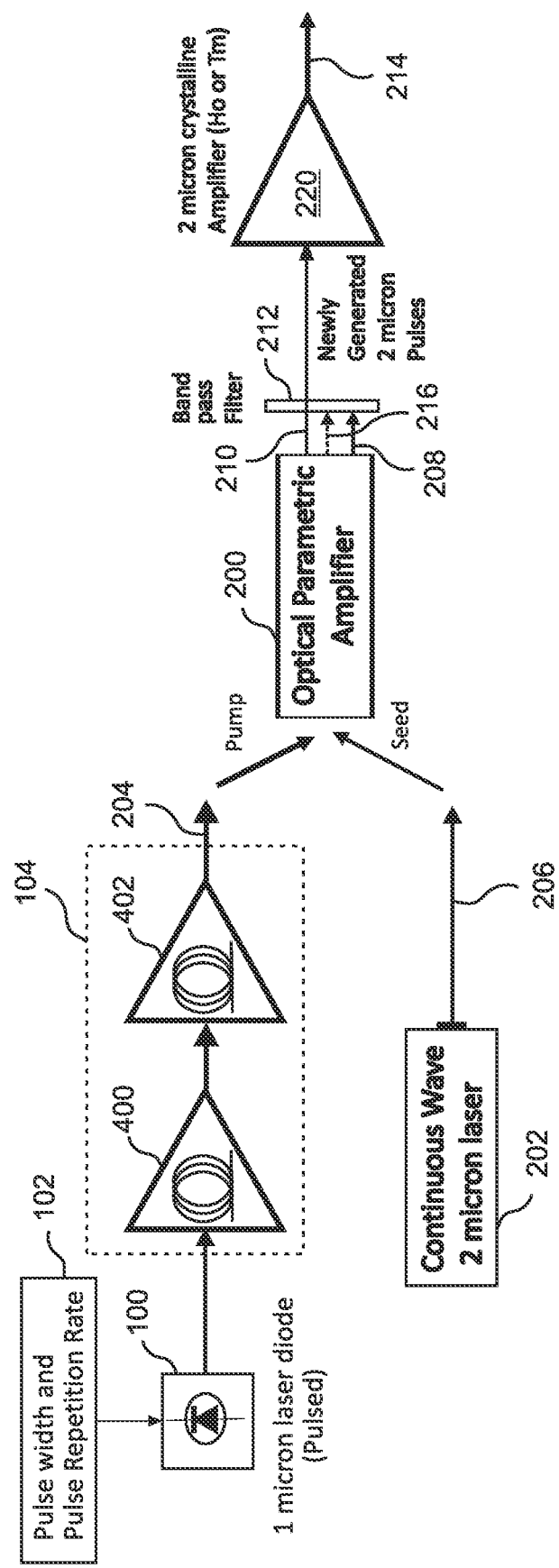
FIG. 4A is a block diagram illustrating an embodiment similar to FIG. 2 in which the fiber optic amplifier includes two amplification stages.

With reference to FIG. 4A, in embodiments the 1 micron fiberoptic amplifier 104 includes a plurality of fiber optic laser amplification stages 400, 402. In some embodiments similar to FIG. 3 the final "power" amplifier 220 comprises a plurality of bulk crystalline laser amplifier stages.

Figure 4B:
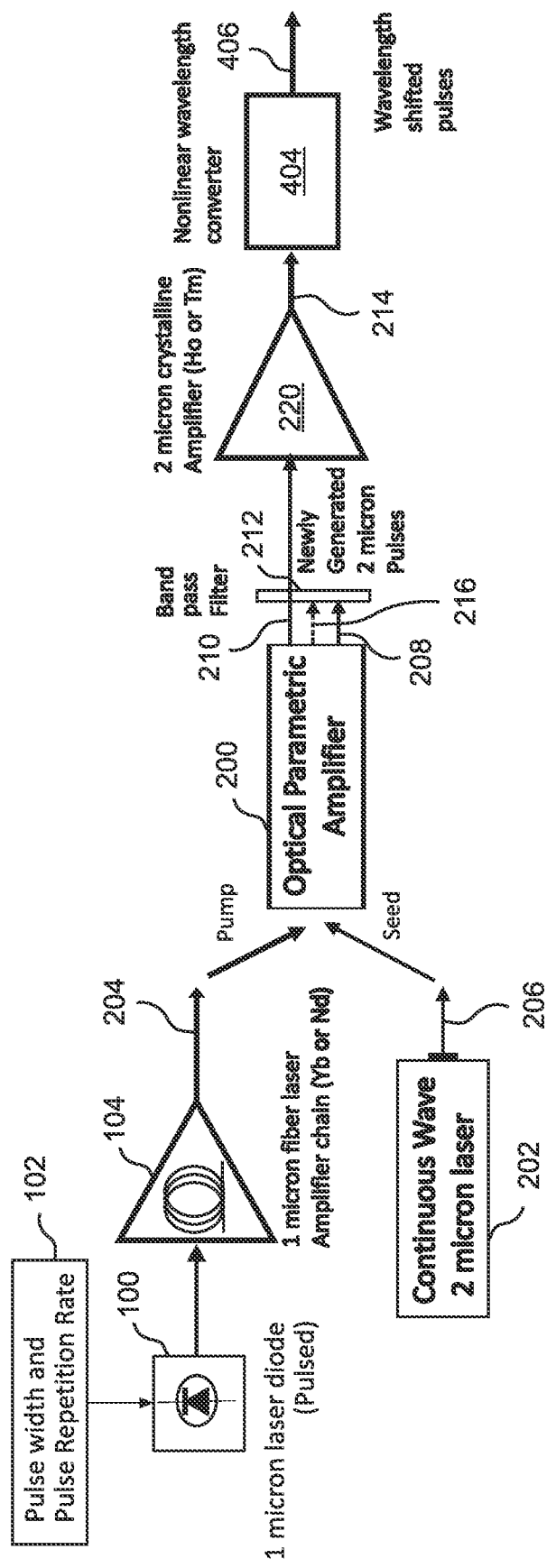
FIG. 4B is a block diagram illustrating an embodiment similar to FIG. 2 in which the 2 micron PRA pulses are converted to another wavelength by an additional non-linear optical device.

With reference to FIG. 4B, in embodiments, the PRA output pulses 214 of the crystalline amplifier 220 can then be further used as a "pump" to drive other nonlinear processes. In the embodiment of FIG. 4B, the PRA output pulses at 2 microns 214 are further down converted to longer wavelength pulses 406 by a parametric oscillator 404. Similar embodiments downshift the PRA output pulses 214 using a parametric amplifier, while still other embodiments upshift the PRA output pulses 214 to shorter wavelengths by using methods such as second harmonic generation or sum frequency generation to achieve agile pulse trains at alternate wavelengths.

Figure 5:
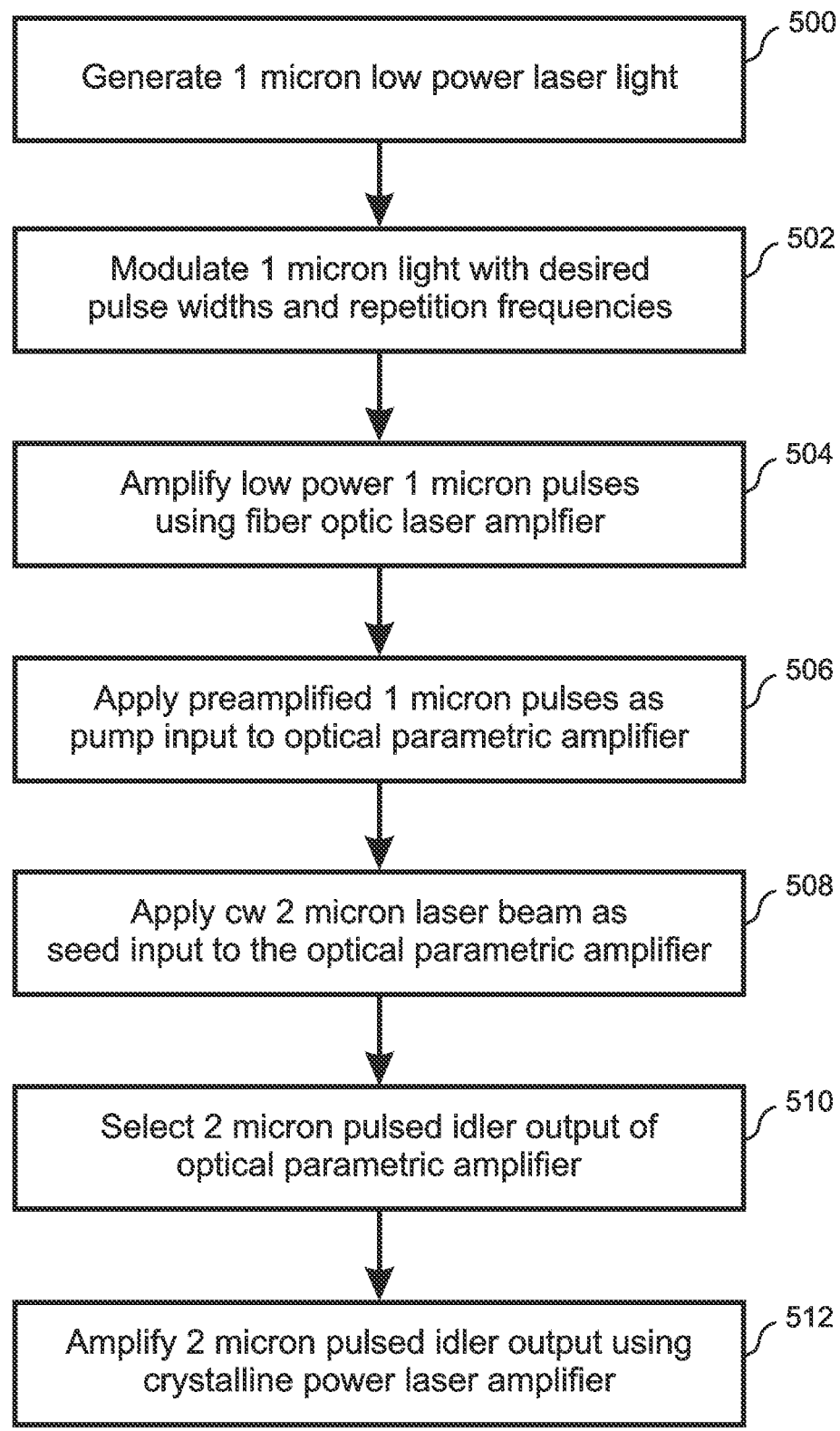
FIG. 5 is a flow diagram illustrating a method embodiment of the present disclosure.

Also included in the present disclosure is a method of generating PRA laser pulses having wavelengths longer than 2000 nm, peak output powers greater than 1 kW, average powers greater than 10 W, pulse widths that are variable from 0.5 to 10 nsec, and variable pulse repetition frequencies (PRF) ranging from 0.1 to over 2 MHz, where the PRA pulses have an extinction of at least 60 dB. With reference to FIG. 5, low power laser light is generated 500 having a wavelength in the 1 micron range, i.e. between 1000 nm and 1100 nm. The 1 micron laser light is modulated 502 so that it has the desired pulse width(s) and pulse repetition rate(s). In some embodiments, a diode laser is used to generate the low power laser light. In some of these embodiments, the modulation is imposed on the laser light by modulating the drive current of the diode laser. In other embodiments, the low power laser light is cw laser light, and is modulated by a separate device, for example an electro-optical modulator, such as a Mach-Zehnder modulator.

The modulated 1 micron laser light is then amplified 504 by a 1 micron fiber optic laser amplifier 104, and applied 506 as the pump input to an optical parametric amplifier (OPA) 200. Continuous wave laser light having a wavelength longer than the pump input is also applied 508 to the OPA 200 as the seed input, wherein a phase matching condition or a quasi-phase matching condition of the OPA is satisfied, thereby causing the OPA 200 to generate a signal output 208 and an idler output 210, where the idler output 210 has a wavelength that is longer than 2000 nm, is modulated according to the modulation of the pump laser pulses, and has a nearly infinite on/off ratio of at least 60 dB. The idler output of the OPA 200 is then selected 510, i.e. separated from the signal output 208, for example using a band pass filter 212. Higher power PRA pulses 214 are then obtained by further amplification 512 of the idler output 210, for example using a bulk crystalline laser amplifier.

In embodiments, the PRA output pulses 214 can be applied to another nonlinear device 404 so as to upshift or downshift the wavelength of the PRA pulses 214 and obtain pulses at yet another wavelength of interest, either at a longer wavelength or at a shorter wavelength as compared to the PRA pulses 214.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications without departing from the spirit thereof. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

What is claimed is:

1. A laser system configured to generate Powerful Rapid and Agile (PRA) laser pulses having a wavelength between 2000 nm and 2100 nm, where the PRA laser pulses are defined as laser pulses having a peak power greater than 1 kW, an average power greater than 10 W, pulse widths that are variable from 0.5 to 10 nanoseconds, and pulse repetition frequencies that are variable from 0.1 MHz to 2 MHz, the laser system comprising:
   a low power laser source configured to generate low power laser pulses having a pump wavelength between 1000 nm and 1100 nm, pulse widths variable from 0.5 ns to 10 ns, and a pulse repetition frequency variable from 0.1 MHz to 2 MHz;

a fiber optic laser amplifier configured to amplify the low power laser pulses to higher power pump laser pulses having a peak power that is greater than 1 kW and an average power that is between 1 W and 20 W;

a seed laser source configured to emit continuous wave seed laser light having a seed wavelength between 1800 and 2500 nm with continuous wave (CW) power between 100 mw and 5 W;

an optical parametric amplifier (OPA) configured to receive the seed laser light as an OPA seed input and the pump laser pulses as an OPA pump input, wherein an OPA crystal of the OPA amplifier, the pump laser pulses, and the seed laser light are configured to satisfy a phase matching condition or a quasi-phase matching condition of the OPA, the OPA being thereby caused to emit a signal laser output and an idler laser output, the idler laser output having the same pulse repetition rate as the pump laser pulses, an idler wavelength that is longer than 2000 nm, and an on/off ratio of at least 60 dB;

a band pass filter configured to separate the idler laser output from the signal laser output; and a crystalline laser amplifier configured to amplify the idler laser output to provide 2 micron PRA pulses having a peak power greater than 1 kW and an average power greater than 10 W;

the pump wavelength and the signal wavelength being selected such that the idler wavelength is within the amplifying wavelength region of the crystalline amplifier.

2. The laser system of claim 1, wherein the low power laser source comprises a diode laser, and wherein a laser output of the diode laser is modulated to form the low power laser light pulses by modulating a driver current that is applied to the diode laser.

3. The laser system of claim 1, wherein the low power laser source comprises a laser that is configured to emit continuous wave (CW) pump laser light, and wherein the CW pump laser light is modulated to form the low power laser pulses by a laser modulating device that is configured to receive the CW pump laser light and to emit the low power laser pulses.

4. The laser system of claim 3, wherein the laser modulating device is an electro-optic modulator that is one of an electro-optic modulator, an acousto-optic modulator, and a semiconductor optical amplifier (SOA).

5. The laser system of claim 4, wherein the electro-optic modulator is a Mach Zehnder modulator.

6. The laser system of claim 1, wherein the fiberoptic laser amplifier comprises an Ytterbium doped fiber.

7. The laser system of claim 1, wherein the fiberoptic laser amplifier comprises a plurality of fiber optic amplification stages.

8. The laser system of claim 1, wherein the OPA includes a quasi phase matched or a birefringent phase matched crystal.

9. The laser system of claim 1, wherein the crystalline laser amplifier comprises a crystal that is doped with Holmium or Thulium.

10. The laser system of claim 1, wherein the crystalline laser amplifier comprises a plurality of crystal laser amplification stages.

11. The laser system of claim 1, wherein the crystalline laser amplifier includes at least one amplification module that is at least one of a multi-pass amplifier and a regenerative amplifier.

12. The laser system of claim 1, further comprising a wavelength shifting element configured to either upshift or downshift the wavelength of the PRA pulses provided by the crystalline laser amplifier.

13. The laser system of claim 1, further comprising a pulse picker configured to further modulate and/or shape the pump laser pulses after amplification thereof by the fiberoptic laser amplifier and before application thereof as the pump input of the OPA.

14. The laser system of claim 1, wherein the pump wavelength is 1030 nm.

15. The laser system of claim 14, wherein:
the seed wavelength is 2030 nm;
the idler wavelength is 2090 nm;
the OPA includes a periodically poled lithium niobate (PPLN) crystal; and
the crystal amplifier includes a Ho:YAG amplifier.

16. The laser system of claim 14, wherein:
the seed wavelength is 2071 nm;
the idler wavelength is 2050 nm;
the OPA includes a periodically poled lithium niobate (PPLN) crystal; and
the crystal amplifier includes a Ho:YLF amplifier.

17. The laser system of claim 1, wherein the crystal laser amplifier includes a Ho:YAG laser that is able to amplify wavelengths between 2089 nm and 2091 nm, as well as 2096 nm.

18. The laser system of claim 1, wherein the crystal laser amplifier includes a Ho:YLF laser that is able to amplify wavelengths between 2050 nm and 2070 nm.

19. The laser system of claim 1, wherein the crystal laser amplifier includes a crystal that is doped with Holmium or Thulium.

* * * * *